(12) United States Patent
Wang et al.

(10) Patent No.: US 10,741,624 B2
(45) Date of Patent: Aug. 11, 2020

(54) ARRAY SUBSTRATE HAVING PIXEL DEFINING LAYER WITH RECESS

(71) Applicants: CHENGDU BOE OPTOELECTRONICS TECHNOLOGY CO., LTD., Chengdu, Sichuan (CN); BOE TECHNOLOGY GROUP CO., LTD., Beijing (CN)

(72) Inventors: Ge Wang, Beijing (CN); Zhiliang Jiang, Beijing (CN)

(73) Assignees: BOE Technology Group Co., Ltd., Beijing (CN); Chengdu BOE Optoelectronics Technology Co., Ltd., Chengdu, Sichuan (CN)

( * ) Notice: Subject to any disclaimer, the term of this patent is extended or adjusted under 35 U.S.C. 154(b) by 0 days.

(21) Appl. No.: 16/414,080

(22) Filed: May 16, 2019

(65) Prior Publication Data
US 2020/0058716 A1  Feb. 20, 2020

(30) Foreign Application Priority Data
Aug. 17, 2018 (CN) .......................... 2018 1 0940525

(51) Int. Cl.
*H01L 27/32* (2006.01)

(52) U.S. Cl.
CPC ...... *H01L 27/3246* (2013.01); *H01L 27/3216* (2013.01)

(58) Field of Classification Search
None
See application file for complete search history.

(56) References Cited

U.S. PATENT DOCUMENTS

| | | | |
|---|---|---|---|
| 2013/0248867 A1* | 9/2013 | Kim | H01L 51/5253 257/59 |
| 2015/0144917 A1* | 5/2015 | Koo | H01L 51/5246 257/40 |
| 2016/0181566 A1* | 6/2016 | Wang | H01L 51/525 257/40 |
| 2018/0006267 A1* | 1/2018 | Sakamoto | H01L 27/3246 |
| 2018/0301521 A1* | 10/2018 | Yang | H01L 27/3211 |

* cited by examiner

*Primary Examiner* — Thien F Tran
(74) *Attorney, Agent, or Firm* — The Webb Law Firm

(57) ABSTRACT

The present disclosure relates to an array substrate, a display panel, and a display device. In an embodiment, an array substrate is provided that comprises: a substrate; and a pixel defining layer disposed on the substrate, the pixel defining layer including a plurality of openings and a partition portion for separating the plurality of openings from each other, wherein the partition portion has a first recess.

10 Claims, 4 Drawing Sheets

ARRAY SUBSTRATE HAVING PIXEL DEFINING LAYER WITH RECESS

CROSS-REFERENCE TO RELATED APPLICATIONS

The present application claims priority to the Chinese Application No. 201810940525.1, filed on Aug. 17, 2018, the entire disclosure of which is hereby incorporated by reference.

FIELD

The present disclosure relates to the field of display technologies, and in particular, to an array substrate, a display panel, and a display device.

BACKGROUND

Organic Light-Emitting Diode (OLED) display devices have been attracting attention as a next-generation display technology with promising prospects.

SUMMARY

According to an aspect of the present disclosure, an array substrate is provided that comprises: a substrate; and a pixel defining layer disposed on the substrate, the pixel defining layer including a plurality of openings and a partition portion for separating the plurality of openings from each other, wherein the partition portion has a first recess.

In an embodiment, the opening is adaptive for forming a light emitting element therein.

In an embodiment, along a thickness direction of the array substrate, a depth of the first recess is smaller than a thickness of the pixel defining layer.

In an embodiment, the partition portion includes a plurality of the first recesses arranged in an array.

In an embodiment, the partition portion includes a plurality of the first recesses parallel to each other, and an extending direction of the plurality of first recesses is parallel to a side of the pixel defining layer.

In an embodiment, the array substrate further comprises a support layer disposed on a side of the partition portion away from the substrate, and the support layer is provided with a plurality of second recesses.

In an embodiment, along a thickness direction of the array substrate, a depth of the second recess is equal to or greater than a thickness of the support layer.

In an embodiment, an orthographic projection of the support layer on the substrate does not overlap an orthographic projection of the first recess on the substrate.

In an embodiment, the support layer comprises a plurality of support posts, each of the support posts being provided with at least one of the plurality of second recesses.

According to another aspect of the present disclosure, a display panel is provided that comprises the array substrate according to any embodiments of the present disclosure.

According to a further aspect of the present disclosure, a display device is provided that comprises the display panel according to any embodiments of the present disclosure.

BRIEF DESCRIPTION OF THE DRAWINGS

The accompanying drawings, which are used to describe the example embodiments as below will be described briefly hereinafter. Obviously, the accompanying drawings are merely some embodiments of the present disclosure, and other embodiments or drawings can be obviously obtained from these drawings by those skilled in the art without need of creative effort.

DETAILED DESCRIPTIONS OF ILLUSTRATIVE EMBODIMENTS

The technical solutions of the embodiments of the present disclosure will be described below with reference to the accompanying drawings. It is obvious that the described embodiments are only a part of the embodiments of the present disclosure, and not all of the embodiments. All other embodiments that can be obtained by a person of ordinary skill in the art based on the embodiments of the present disclosure without inventive efforts are intended to be embraced in the scope of the present disclosure.

In an OLED, pixels are separated by a pixel defining layer. Support posts are formed on the pixel defining layer to be periodically arranged to support the evaporation mask for the organic light emitting material.

Figure 1:
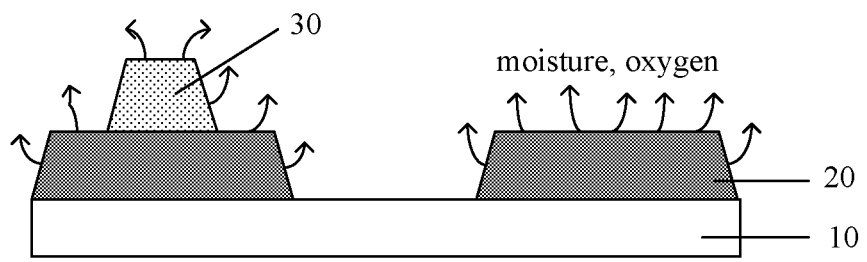
FIG. 1 is a schematic view of an array substrate.

As shown in FIG. 1, the materials of the pixel defining layer 20 and the supporting layer 30 disposed on the substrate 10 are all polyimide (PI) materials, and prone to absorb moisture, oxygen, and the like. Since the organic light-emitting material is sensitive to the moisture, oxygen and the like, the pixel defining layer 20 and the support layer 30 will be baked with high temperature oven, after being prepared, to remove the moisture, oxygen and the like.

However, due to the large area of the pixel defining layer, even being high-temperature baked, the pixel defining layer of a large area may still contain a small amount of moisture, oxygen, and the like. This moisture and oxygen will slowly permeate in the subsequent use of the OLED, causing erosion of the organic light-emitting material. Thus, the area in which the organic light-emitting material can emit light shrinks, resulting in a decrease in the light-emitting area of the pixel or even failure in light emitting.

In order to at least alleviate or overcome at least one of the problems described above, the solutions of the present disclosure are proposed.

Figure 2:
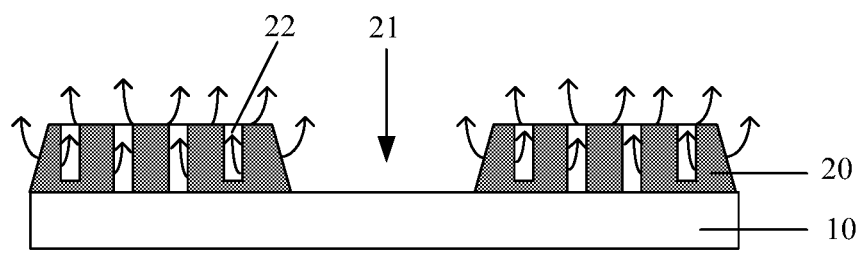
FIG. 2 is a schematic diagram of an array substrate according to some embodiments of the present disclosure.

According to embodiments of the present disclosure, an array substrate is provided. As shown in FIG. 2, the array substrate includes a substrate 10 and a pixel defining layer 20 disposed on the substrate 10. The pixel defining layer 20 includes a plurality of openings 21 and a partition portion 50 for separating the plurality of openings 21 from each other. The partition portion 50 has a first recess 22.

The opening 21 corresponds to the open area of the array substrate. In other words, the opening 21 can be used to form a light-emitting element such as an OLED therein.

Figure 3:
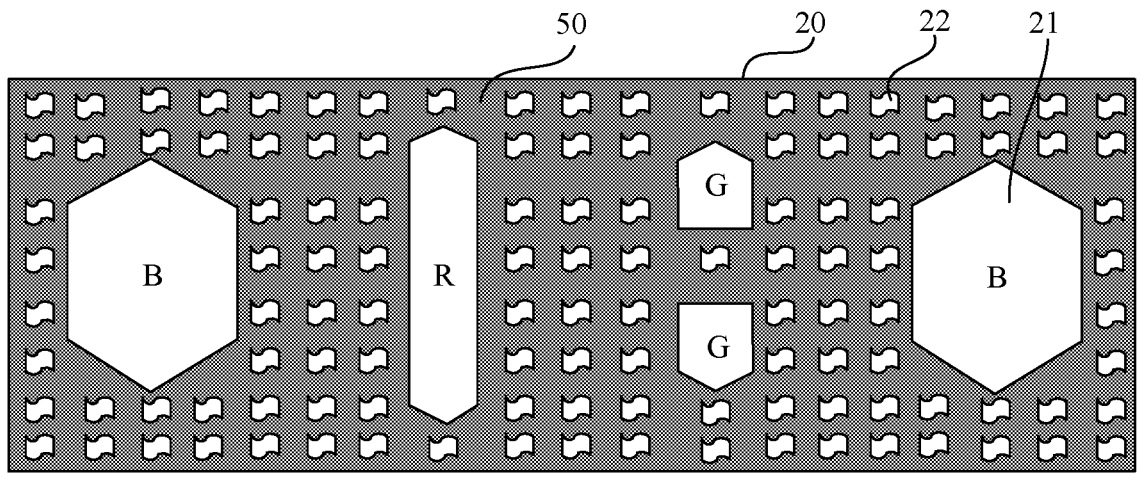
FIG. 3 is a schematic top plan view of a pixel defining layer according to some embodiments of the present disclosure.

In some embodiments, as shown in FIG. 2, along the thickness direction of the array substrate, the depth of the first recess 22 may be equal to the thickness of the pixel defining layer 20. In some embodiments, the depth of the first recess 22 may also be less than the thickness of the pixel defining layer 20. FIGS. 3-7 are top views of array substrates according to some embodiments of the present disclosure. FIG. 3 shows an example in which the depth of the first recess 22 is equal to the thickness of the pixel defining layer 20. FIGS. 4-7 illustrate examples in which the depth of the first recess 22 is smaller than the thickness of the pixel defining layer 20, that is, the first recess 22 is disposed to penetrate only a portion of the thickness of the pixel defining layer 20.

Those skilled in the art will readily understand that the pixel defining layer 20 includes an opening 21 corresponding to the open area of the array substrate, and the first recess 22 may be disposed in an area other than the opening 21, that is, disposed in the partition portion which separates the plurality of openings from each other. There is no limit on the number, shapes, and arrangement of the first recesses 22 in the embodiment of the present disclosure. As shown in FIGS. 3-7, the first recesses 22 may be plural, and the shape of the first recess 22 (for example, the shape of the projection on the substrate) may be any closed pattern, and the same pixel defining layer 20 may include first recesses 22 of different shapes.

Figure 4:
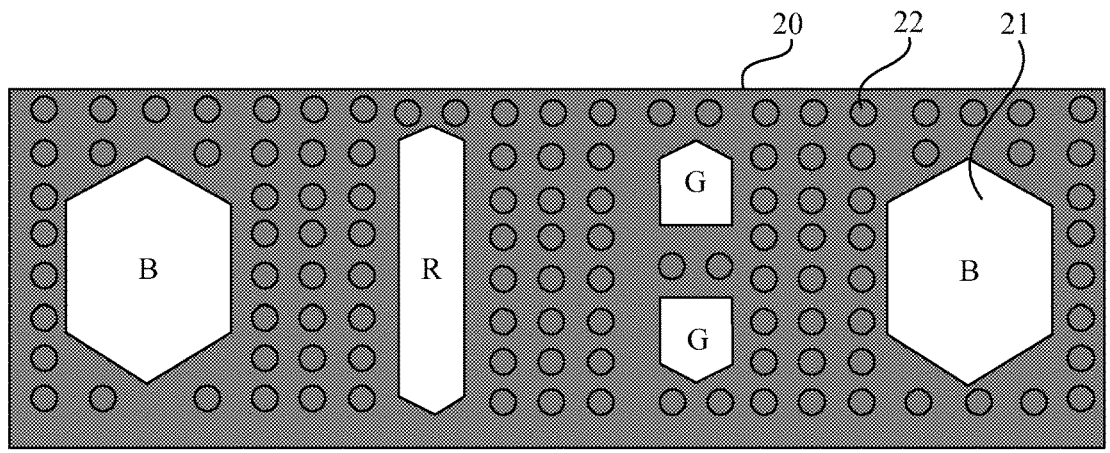
FIG. 4 is a schematic top plan view of a pixel defining layer according to some embodiments of the present disclosure.
Figure 5:
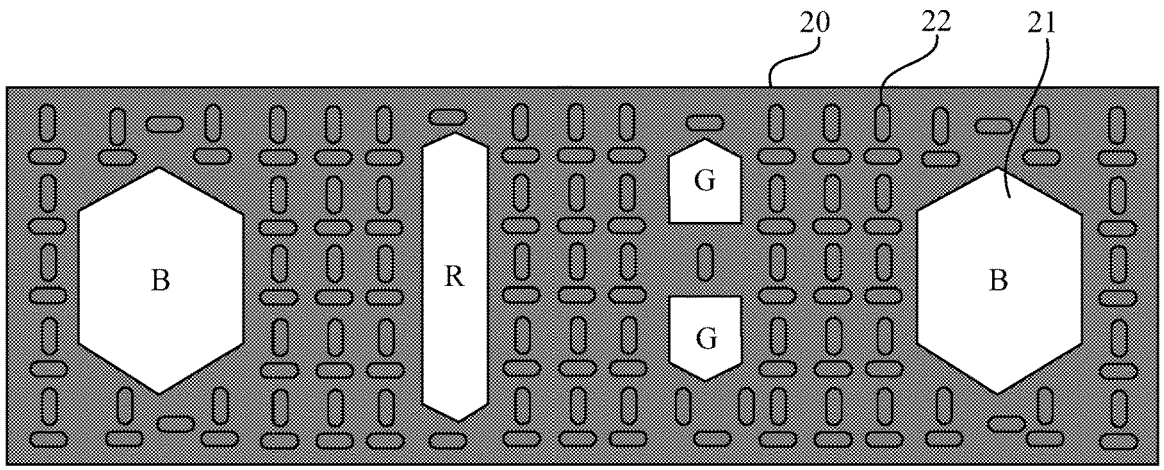
FIG. 5 is a schematic top plan view of a pixel defining layer according to some embodiments of the present disclosure.
Figure 6:
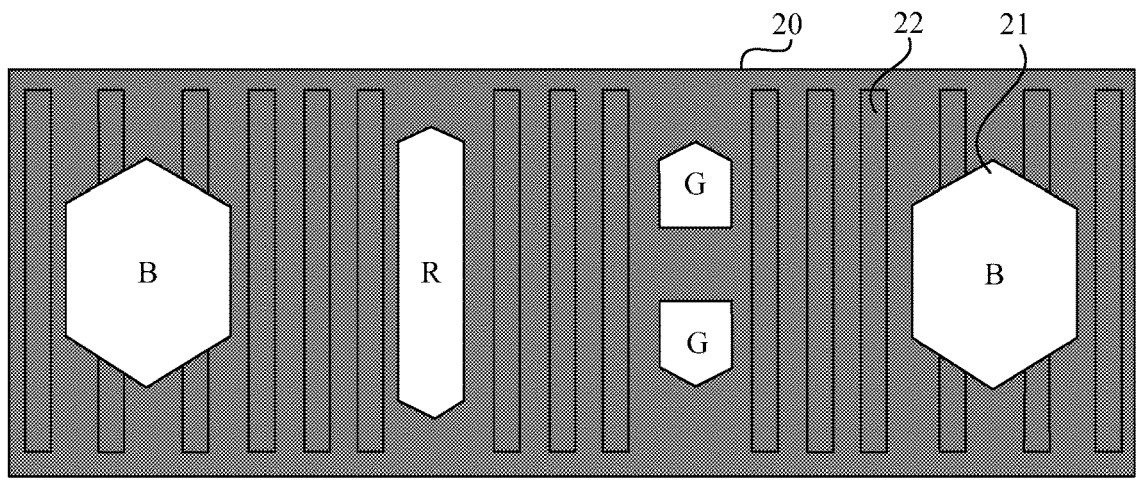
FIG. 6 is a schematic top view of a pixel defining layer according to some embodiments of the present disclosure.
Figure 7:
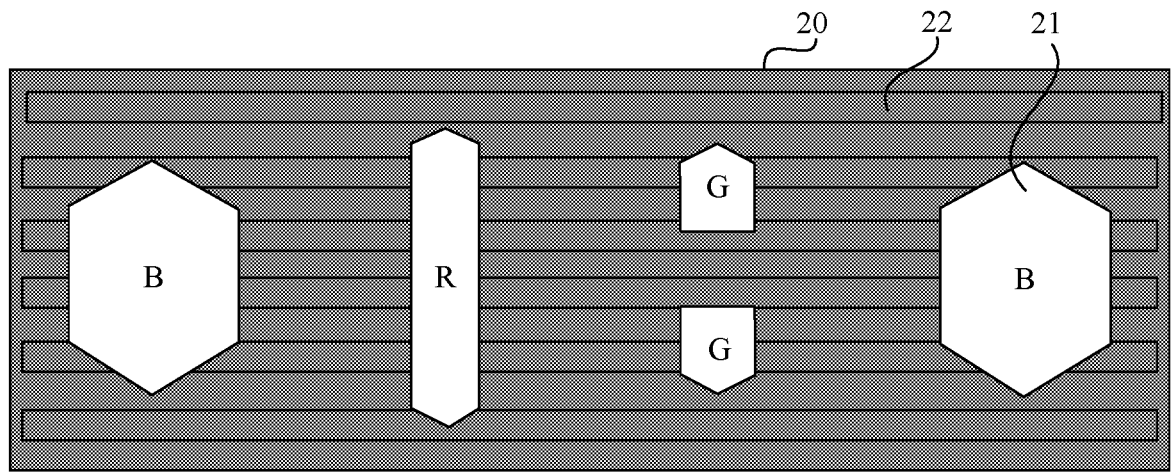
FIG. 7 is a schematic top view of a pixel defining layer according to some embodiments of the present disclosure.

Regarding the positional relationship between the first recesses 22 and the opening 21, as shown in FIG. 3 to FIG. 5, the first recesses 22 can be separated from the opening 21 and thus are not directly connected to the opening 21. Or, as shown in FIG. 6 and FIG. 7, the first recess 22 can be in communication with the opening 21. Optionally, in the case where the first recesses 22 are in communication with the opening 21, the depth and/or width of the first recesses 22 may be configured to be smaller than the thickness and/or width of the pixel defining layer 20 to avoid changing the shape of the open area.

The opening 21 may correspond to an open area of the array substrate. In other words, the opening 21 is used to form a light-emitting element therein. The outline shape and position of the opening 21 correspond to those of the open area of the array substrate. In some embodiments, the orthographic projection of the opening 21 on the substrate 10 coincides with the orthographic projection of the open area of the array substrate on the substrate 10.

Those skilled in the art will readily understand that the open area of the array substrate is an open area of the array substrate corresponding to the sub-pixel area. A light emitting element such as an OLED or the like may be formed in the opening area. For the shape of the open area of the array substrate, there is no limitation thereon in the embodiment of the present disclosure, and the shape of the open area of the array substrate can be designed according to the target illumination effect or as needed. Various configurations of the shape and position of the red light-emitting region (sub-pixel) R, the green light-emitting region (sub-pixel) G, and the blue light-emitting region (sub-pixel) B are schematically shown in FIGS. 3 to 7. It should be understood that these illustrated embodiments are illustrative only and not for limiting the scope of the present disclosure.

Those skilled in the art will readily appreciate that the first recess 22 is provided to provide a discharge path for moisture, oxygen, etc. without substantially altering the electrical configuration of the substrate. For example, the location and contour shape of the recesses are configured to ensure that the conductive layers on either side of the pixel defining layer 20 do not short-circuited at the first recess 22.

According to the array substrate of the embodiment of the present disclosure, the first recess 22 is disposed in the pixel defining layer 20. Thus, the first recess 22 can be used as a passage for moisture, oxygen and the like during the high temperature oven process. In this way, the moisture, oxygen and the like inside the pixel defining layer 20 can be released not only through the surface of the pixel defining layer 20, but also through the first recesses 22. The effect of discharging moisture, oxygen and the like inside the pixel defining layer 20 can be improved, and the effect is significant particularly for the pixel defining layer 20 of a large area. Therefore, the problem of pixel shrinkage due to out gas or moisture during subsequent use can be improved.

In some embodiments, as shown in FIGS. 4-8, the depth of the first recess 22 may be set to be smaller than the thickness of the pixel defining layer 20, along the thickness direction of the array substrate.

In some embodiments, a conductive layer may be disposed on a side of the pixel defining layer 20, which is away from the substrate 10, and/or a side thereof which is adjacent to the substrate 10. For example, after the pixel defining layer is formed, a conductive layer may be formed on the pixel defining layer in a subsequent process. Therefore, the depth of the first recess 22 can be set to be smaller than the thickness of the pixel defining layer 20, to avoid the occurrence of electrical connection (short circuit) of the conductive layer on the side of the pixel defining layer 20, which is away from the substrate 10, and the conductive layer on the side of the pixel defining layer 20, which is close to the substrate 10, at the first recess 22. That is, the first recess 22 can be configured to not penetrate through the pixel defining layer.

In order to improve the removal effect of the moisture, oxygen and the like, and to simplify the fabrication process of the pixel defining layer 20, in some embodiments, the pixel defining layer 20 may include a plurality of first recesses 22 arranged in an array.

In order to cause moisture, oxygen and the like in the pixel defining layer 20 to be released along the first recess(es) 22, in some embodiments, as shown in FIGS. 6 and 7, the pixel defining layer 20 may include a plurality of first recesses 22 disposed in the same direction. For example, the plurality of first recesses 22 may be disposed to be parallel to each other. In some embodiments, the first recess 22 extends in a direction parallel to a side of the pixel defining layer 20.

In some embodiments, each of the first recesses 22 can be configured to be parallel to a side of the pixel defining layer 20. The side herein may be any side of the pixel defining layer 20. In some embodiments, among the sides of the pixel defining layer 20, a side that is parallel to a side of the substrate 10 is parallel to the direction in which the first recesses 22 extend.

Illustratively, the first recess 22 can be a groove. The extending direction of the groove may be parallel to the extending direction of the pixel defining layer 20. The grooves may extend to the edge of the pixel defining layer 20 to form grooves that are open at both ends; or may not extend to the edges of the pixel defining layer 20 to form grooves which are closed at both ends.

Figure 8:
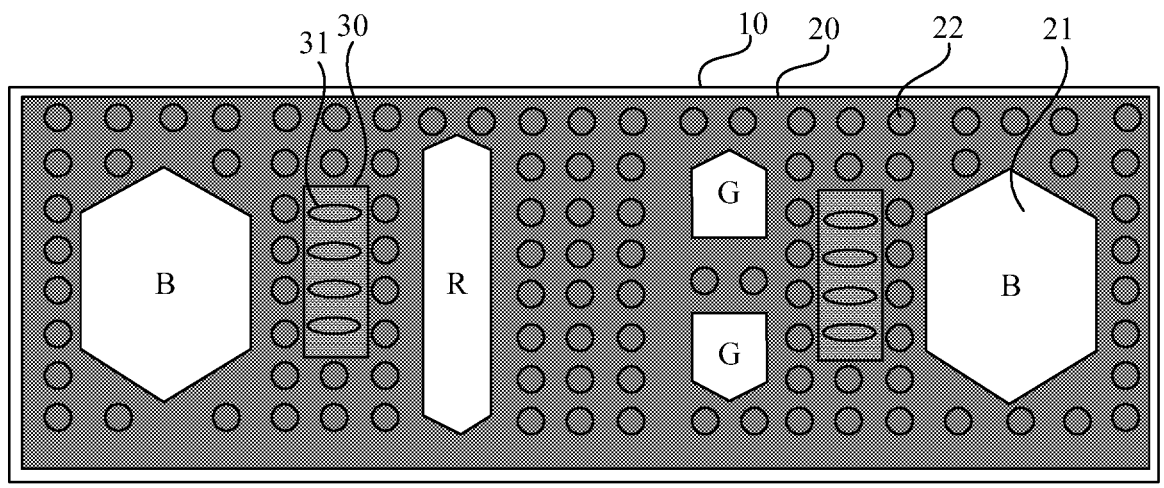
FIG. 8 is a schematic top plan view of an array substrate according to some embodiments of the present disclosure.
Figure 9:
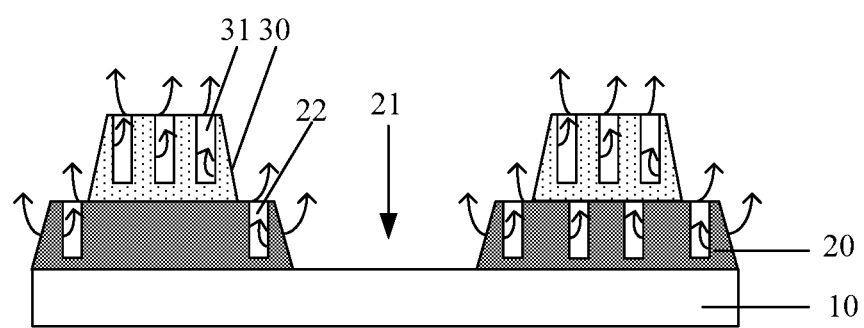
FIG. 9 is a schematic diagram of an array substrate according to some embodiments of the present disclosure.

In some embodiments, as shown in FIGS. 8 and 9, the array substrate further includes a support layer 30 disposed on a side of the pixel defining layer 20, which away from the substrate 10. In some embodiments, the support layer 30 is provided with a second recess 31. The support layer 30 is disposed on the partition portion 50 of the pixel defining layer 20.

The second recess 31 may be formed in the same or similar method steps as the first recess 22. Of course, since the thickness of the pixel defining layer 20 is not necessarily the same as the thickness of the supporting layer 30, the depth of the first recess 22 and the depth of the second recess 31 can be different. The depth of the second recess 31 may be equal to the depth of the support layer 30, however the present disclosure shall not be limited thereto, and the depth of the second recess 31 may be smaller or larger than the depth of the support layer 30.

In some embodiments, the support layer 30 includes a plurality of support posts. The orthographic projection of the support posts on the substrate 10 may overlap the first recesses 22, such as the support post as shown in the right side of FIG. 9. In other embodiments, the orthographic projection of the support posts on the substrate 10 may not overlap the first recesses 22, such as the support post illustrated on the left side of FIG. 9. That is, the orthographic projection of the support layer 30 on the substrate 10 may or may not overlap the orthographic projection of the first recess 22 on the substrate 10.

In some embodiments, in the case that the orthographic projection of the support layer 30 on the substrate 10 overlaps the orthographic projection of the first recess 22 on the substrate 10, the orthographic projection of the second recesses 31 on the substrate 10 overlaps with the orthographic projection of the first recesses 22 on the substrate 10. The depth of the second recess 31 may be configured to be equal to the depth of the support layer 30, and the second recess 31 exposes the first recess 22. In some embodiments, the second recesses 31 can extend through the support layer 30 and into the pixel defining layer.

In the embodiment of the present disclosure, there is no limitation on the preparation processes for the pixel defining layer 20 and the support layer 30, and the pixel defining layer 20 and the supporting layer 30 can be prepared by using processes and materials known in the art or developed in the future. In addition, the pixel defining layer 20 and the supporting layer 30 can be formed simultaneously with a same process, or can be formed by two patterning processes.

The array substrate of the embodiment of the present disclosure may further include a support layer 30. The material of the support layer 30 may be the same as the material of the pixel defining layer 20, for example, both PI materials. Therefore, the support layer 30 may also have a problem that moisture, oxygen and the like are not completely removed. According to the embodiment of the present disclosure, a second recess is provided in the support layer 30 such that moisture, oxygen, and the like in the support layer 30 can be discharged through the second recess 31 during the high temperature process, thereby improving the effect of discharging the moisture, oxygen, and the like in the support layer 30. Therefore, the problem that the pixel shrinkage due to the out gas of the support layer 30 during subsequent use can be prevented or avoided as much as possible.

Figure 10:
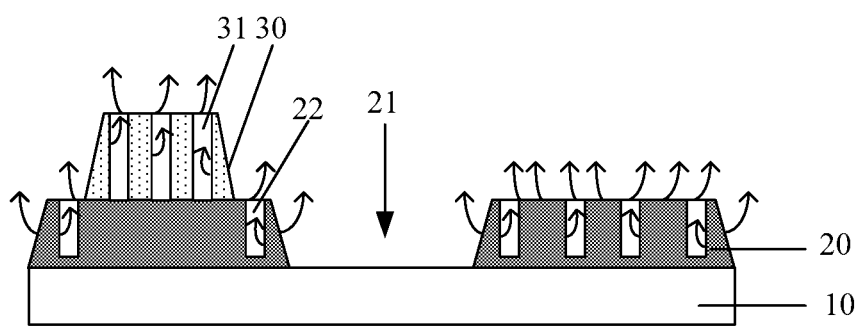
FIG. 10 is a schematic diagram of an array substrate according to some embodiments of the present disclosure.

In some embodiments, as shown in FIG. 10, the depth of the second recess 31 is equal to the thickness of the support layer 30, along the thickness direction of the array substrate. Thereby the second recess 31 exposes a portion of the surface of the pixel defining layer 20 which is close to the support layer 30. Since the presence of the recess 31 in the support layer 30 does not cause a short circuit between the conductive layers, the depth of the second recess 31 may be set to be the same as or different from the thickness of the support layer 30.

In some embodiments, as shown in FIG. 10, the orthographic projection of support layer 30 on the substrate 10 does not overlap the orthographic projection of first recess 22 on the substrate 10.

In some embodiments, the orthographic projection of support layer 30 on the substrate 10 falls within the orthographic projection of pixel defining layer 20 on the substrate 10.

According to some embodiments of the present disclosure, the flatness of the support layer 30 can be improved by making the orthographic projection of the support layer 30 on the substrate 10 and the orthographic projection of the first recess 22 on the substrate 10 not overlap. In some embodiments, the first recess 22 is not provided in a region where the pixel defining layer 20 overlaps the support layer 30, thus the pattern of the pixel defining layer 20 can be simplified and the flatness of the supporting layer 30 can be improved.

In some embodiments, the support layer 30 includes a plurality of support posts each of which is provided with a second recess 31.

The support posts may be disposed between adjacent openings 21, or may also not be provided between adjacent openings 21. The arrangements of the second recesses 31 of the adjacent support posts may be the same or different.

According to an embodiment of the present disclosure, by providing the second recess 31 in each of the support posts, the discharge effect of moisture, oxygen, and the like of each of the support posts can be improved.

According to embodiments of the present disclosure, a display panel is provided that includes the array substrate as above described.

The display panel of the embodiments of the present disclosure may be, for example, an organic electroluminescent diode display panel.

The display panel of the embodiments of the present disclosure includes the array substrate as above described, and thus has the beneficial effect(s) that is/are the same as those of the above array substrates.

Embodiments of the present disclosure also provide a display device including a display panel as above described.

The display device may be specifically any product or component having display function, such as an OLED display, an OLED TV, a digital photo frame, a mobile phone, a tablet computer, a navigator, or the like.

The display device of the embodiments of the present disclosure includes the display panel as above described, and thus has the beneficial effects which are the same as those of the above display panel and thus are not described herein again.

It should be understood that only some exemplary embodiments of the present disclosure are described in the above description, and the present disclosure shall not be limited thereto. It is obvious for those skilled in the art that various changes, modifications or substitutions can be obtained in accordance with the present disclosure without departing from the scope of the present disclosure. Those changes, modifications or substitutions that fall within the spirit and scope of the present disclosure are intended to be embraced by the present disclosure. Accordingly, the scope of the disclosure should be defined only by the appended claims.

What is claimed is:

1. An array substrate comprising:
   a substrate; and
   a pixel defining layer disposed on the substrate, the pixel defining layer including a plurality of openings and a partition portion for separating the plurality of openings from each other,
   wherein the partition portion has a first recess, and
   wherein the array substrate further comprises a support layer disposed on a side of the partition portion away from the substrate, and the support layer is provided with a plurality of second recesses.

2. The array substrate of claim 1, wherein each opening of the plurality of openings is adaptive for forming a light emitting element therein.

3. The array substrate according to claim 1, wherein along a thickness direction of the array substrate, a depth of the first recess is smaller than a thickness of the pixel defining layer.

4. The array substrate according to claim 1, wherein the partition portion includes a plurality of first recesses arranged in an array.

5. The array substrate according to claim 1, wherein the partition portion includes a plurality of first recesses parallel to each other, and an extending direction of the plurality of first recesses is parallel to a side of the pixel defining layer.

6. The array substrate according to claim 1, wherein along a thickness direction of the array substrate, a depth of each second recess of the plurality of second recesses is equal to or greater than a thickness of the support layer.

7. The array substrate of claim 1, wherein an orthographic projection of the support layer on the substrate does not overlap an orthographic projection of the first recess on the substrate.

8. The array substrate of claim 1, wherein the support layer comprises a plurality of support posts, each of the plurality of support posts being provided with at least one of the plurality of second recesses.

9. A display panel comprising the array substrate of claim 1.

10. A display device comprising the display panel of claim 9.

* * * * *